United States Patent
Brandenburg et al.

(10) Patent No.: US 11,217,505 B2
(45) Date of Patent: Jan. 4, 2022

(54) HEAT EXCHANGER FOR ELECTRONICS

(71) Applicant: Aptiv Technologies Limited, St. Michael (BB)

(72) Inventors: Scott D. Brandenburg, Kokomo, IN (US); Mark W. Hudson, Russiaville, IN (US)

(73) Assignee: Aptiv Technologies Limited, St. Michael (BB)

( * ) Notice: Subject to any disclaimer, the term of this patent is extended or adjusted under 35 U.S.C. 154(b) by 0 days.

(21) Appl. No.: 16/566,068

(22) Filed: Sep. 10, 2019

(65) Prior Publication Data
US 2021/0074605 A1     Mar. 11, 2021

(51) Int. Cl.
*H01L 23/367* (2006.01)
*H01L 23/373* (2006.01)

(52) U.S. Cl.
CPC ...... *H01L 23/3675* (2013.01); *H01L 23/3677* (2013.01); *H01L 23/373* (2013.01)

(58) Field of Classification Search
CPC .............. H01L 23/373; H01L 23/3675; H01L 23/3677; H01L 23/46–48; F28F 1/30; F28F 2240/00; F28F 3/06; F28F 1/126
See application file for complete search history.

(56) References Cited

U.S. PATENT DOCUMENTS

| | | | | |
|---|---|---|---|---|
| 4,697,205 A * | 9/1987 | Eastman | ................ | H01L 23/427 257/684 |
| 6,082,443 A * | 7/2000 | Yamamoto | .......... | F28D 15/0233 165/104.21 |
| 6,256,201 B1 * | 7/2001 | Ikeda | .................. | F28D 15/0233 165/104.26 |
| 7,119,433 B2 * | 10/2006 | Corbin, Jr. | ............ | H01L 23/367 257/706 |
| 7,339,791 B2 * | 3/2008 | Hoover | ............... | H01L 23/3732 174/259 |
| 7,609,520 B2 * | 10/2009 | Chang | ................. | F28D 15/0233 165/104.33 |
| 7,786,486 B2 * | 8/2010 | Casey | ................... | H01L 23/373 257/76 |

(Continued)

FOREIGN PATENT DOCUMENTS

| JP | H06177320 | 6/1994 |
|---|---|---|
| JP | H06224334 | 8/1994 |

(Continued)

OTHER PUBLICATIONS

U.S. Appl. No. 16/026,261, Electrical-Circuit Assembly With Heat-Sink, filed Jul. 3, 2018, Scott D. Brandenburg.

(Continued)

*Primary Examiner* — Bilkis Jahan
*Assistant Examiner* — Victor V Barzykin
(74) *Attorney, Agent, or Firm* — Carlson, Gaskey & Olds, P.C.

(57) ABSTRACT

An electronics heat exchanger including a fluid flow body having a first panel, a second panel, and at least one fluid flow guide connecting the first panel and the second panel, a plurality of pedestals extending from the second panel, the plurality of pedestals including at least a first pedestal having a first height and a second pedestal having a second height, distinct from the first height, and wherein each of the pedestals is integral with the second panel.

12 Claims, 3 Drawing Sheets

(56) References Cited

U.S. PATENT DOCUMENTS

| | | | |
|---|---|---|---|
| 7,796,389 B2* | 9/2010 | Edmunds | H01L 23/427 361/700 |
| 9,713,284 B2* | 7/2017 | Gao | H01L 23/473 |
| 10,580,717 B2* | 3/2020 | Liu | H01L 25/18 |
| 10,867,980 B2* | 12/2020 | Hori | H01L 25/115 |
| 2005/0040518 A1 | 2/2005 | Brandenburg et al. | |
| 2005/0141195 A1* | 6/2005 | Pokharna | F28F 3/025 361/699 |
| 2005/0185379 A1* | 8/2005 | Vinson | G06F 1/20 361/704 |
| 2006/0033195 A1 | 2/2006 | Thompson et al. | |
| 2006/0038284 A1 | 2/2006 | Brandenburg et al. | |
| 2006/0274512 A1 | 12/2006 | Brandenburg et al. | |
| 2007/0004090 A1 | 1/2007 | Brandenburg et al. | |
| 2007/0268671 A1 | 11/2007 | Brandenburg et al. | |
| 2008/0212296 A1 | 9/2008 | Brandenburg et al. | |
| 2009/0139704 A1* | 6/2009 | Otoshi | H01L 23/367 165/185 |
| 2010/0084761 A1* | 4/2010 | Shinagawa | H01L 23/3128 257/706 |
| 2010/0265709 A1 | 10/2010 | Liu | |
| 2015/0001701 A1* | 1/2015 | Li | H01L 23/3737 257/713 |
| 2015/0021756 A1* | 1/2015 | Adachi | H01L 23/3672 257/714 |
| 2015/0168086 A1* | 6/2015 | Knowles | F28D 15/02 165/104.31 |
| 2016/0088762 A1* | 3/2016 | Wu | H05K 7/20336 361/700 |
| 2016/0197025 A1* | 7/2016 | Bhagwagar | H01L 23/42 257/717 |
| 2019/0371705 A1* | 12/2019 | Yamauchi | H01L 23/3675 |
| 2020/0008291 A1* | 1/2020 | Brandenburg | H05K 7/20336 |

FOREIGN PATENT DOCUMENTS

| | | |
|---|---|---|
| JP | H011340384 | 12/1999 |
| JP | 2018098469 | 6/2018 |

OTHER PUBLICATIONS

European Search Report for Patent Application No. 20194745.4 dated Feb. 4, 2021.

* cited by examiner

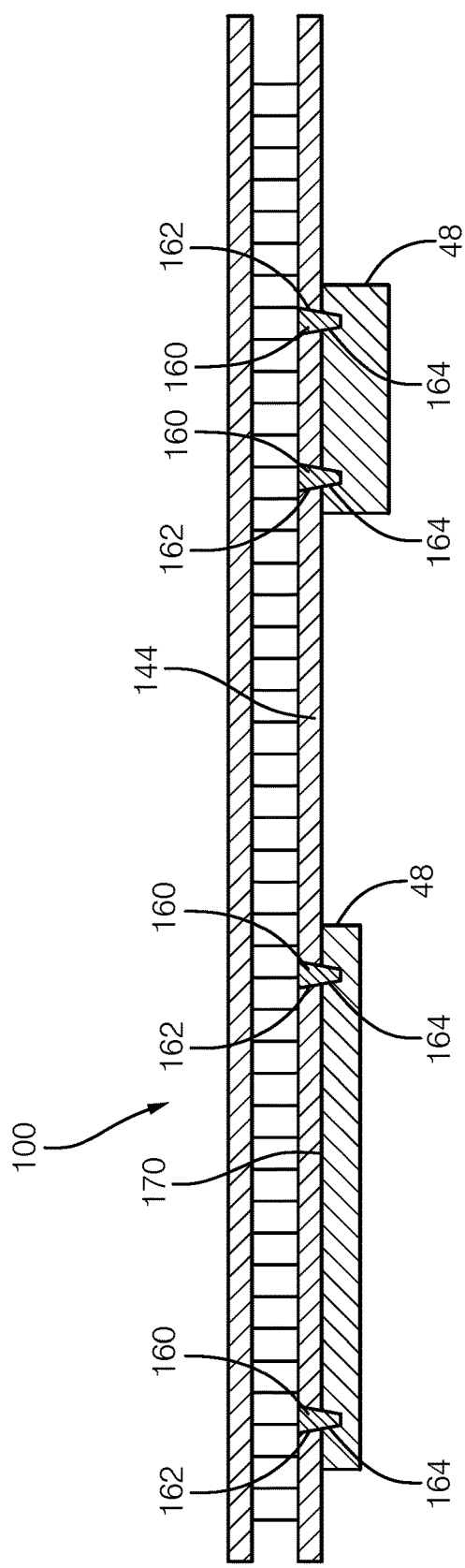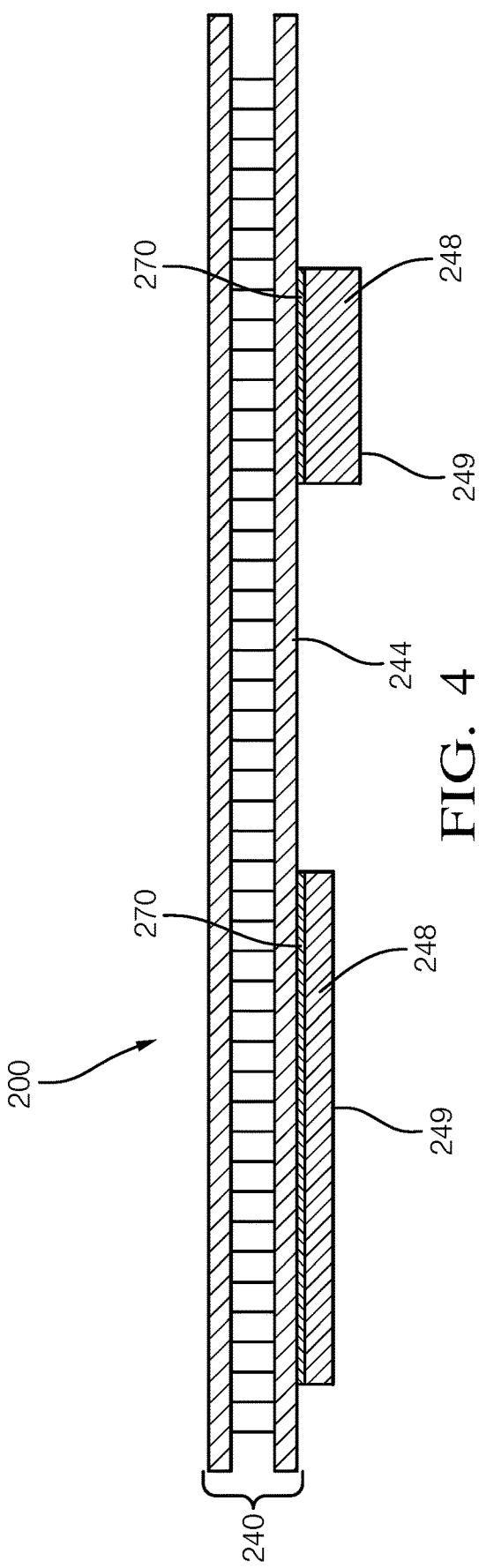

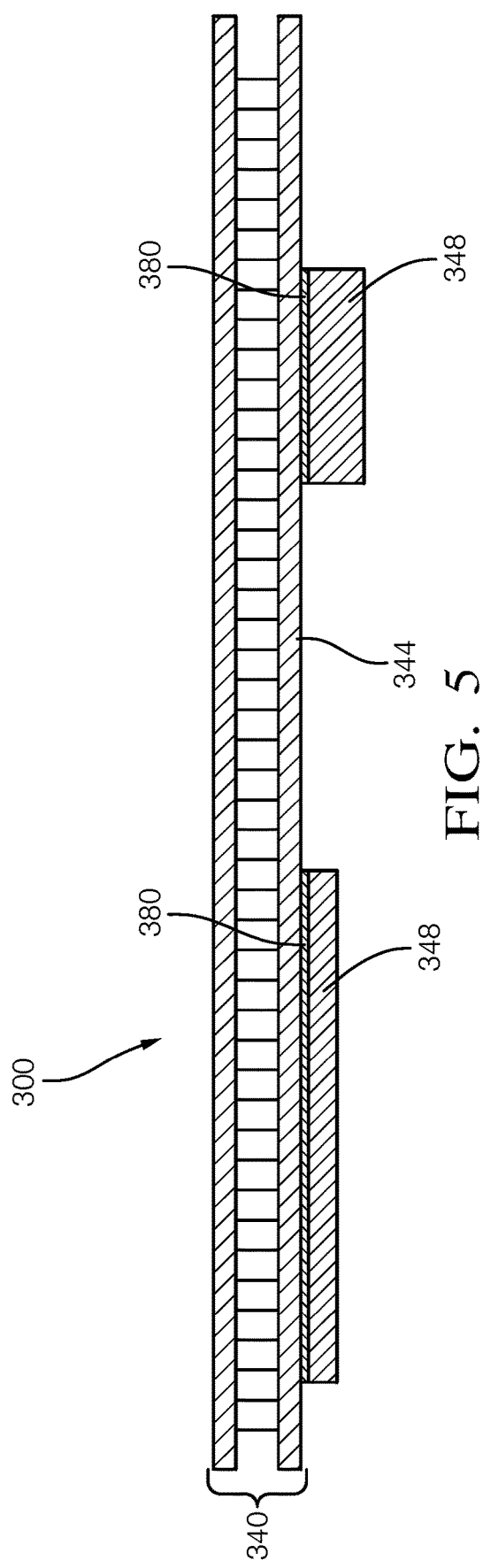
FIG. 5
FIG. 6
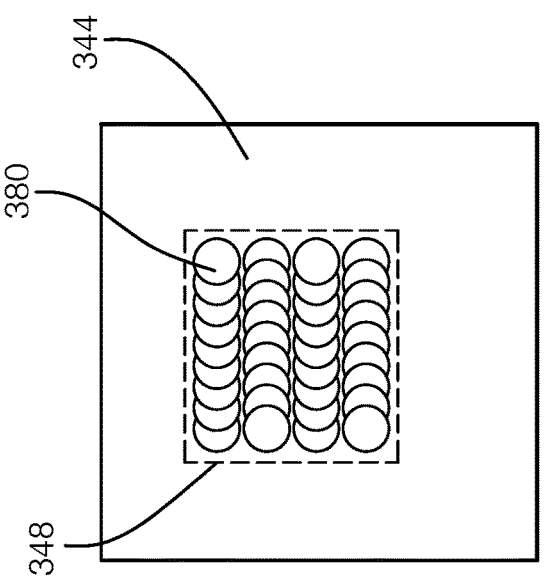
FIG. 7

HEAT EXCHANGER FOR ELECTRONICS

TECHNICAL FIELD

The present disclosure relates generally to heat exchangers for electronics, and more specifically to heat exchangers for cooling an application specific integrated circuit, or similar printed circuit board and electronic components.

BACKGROUND

Application specific integrated circuits, as well other printed circuit boards including heat generating electronic components require the removal of heat in order to guarantee reliable operations. In some applications, such as those common in automotive systems, sufficient removal of heat from the electronics can be challenging.

One solution to removing heat from such electronic systems that has been employed in the field includes disposing a flat heat exchanger, such as a folded fin heat exchanger contacting the electronics generating the heat. The heat exchanger removes heat from the electronics and disperses the heat into the adjacent atmosphere.

SUMMARY OF THE INVENTION

In one exemplary embodiment an electronics heat exchanger includes a fluid flow body having a first panel, a second panel, and at least one fluid flow guide connecting the first panel and the second panel, a plurality of pedestals extending form the second panel, the plurality of pedestals including at least a first pedestal having a first height and a second pedestal having a second height, distinct from the first height, and wherein each of the pedestals is integral with the second panel.

In another example of the above described electronics heat exchanger each of the pedestals comprises a first material and wherein the second panel is comprised of the first material.

In another example of any of the above described electronics heat exchangers at least one of the pedestals comprises a first material and the second panel is comprised of a second material distinct form the first material.

Another example of any of the above described electronics heat exchangers further includes a plurality of pins each pin in the plurality of pins protruding through a corresponding through hole in the second panel and into a corresponding partial opening in a pedestal in the plurality of pedestals.

In another example of any of the above described electronics heat exchangers each pin is comprised of a first material and a corresponding pedestal is comprised of the first material.

In another example of any of the above described electronics heat exchangers each pin is press fit with at least one of the corresponding through hole and the corresponding partial opening.

In another example of any of the above described electronics heat exchangers each pedestal defines a corresponding contact footprint, and wherein each contact footprint is smaller than a perimeter of the pedestal.

In another example of any of the above described electronics heat exchangers each pedestal defines a corresponding contact footprint and the corresponding contact footprint covers an entire surface of the pedestal.

Another example of any of the above described electronics heat exchangers further includes a sinter layer disposed between each pedestal in the plurality of pedestals and the second panel.

In another example of any of the above described electronics heat exchangers the sinter layer is comprised of one of a silver sintering material and a copper sintering material.

Another example of any of the above described electronics heat exchangers further includes a plurality of weld zones each weld zone connecting a corresponding pedestal to the second panel.

In another example of any of the above described electronics heat exchangers each weld zone is smaller than a corresponding contact footprint.

An exemplary method for assembling an electronics heat exchanger assembly includes making a bottom plate and a plurality of pedestals integral, wherein the plurality of pedestals includes a first pedestal having a first height and a second pedestal having a second height placing a folded fin assembly on the bottom plate and a top plate on the folded fin assembly after making the bottom plate and the plurality of pedestals integral and brazing the assembly such that the top plate, the folded fin assembly, and the bottom plate are an integral component.

In another example of the above described exemplary method for assembling an electronics heat exchanger assembly making the bottom plate and the plurality of pedestals integral comprises sintering each of the pedestals to the bottom plate.

In another example of any of the above described exemplary methods for assembling an electronics heat exchanger assembly sintering each of the pedestals to the bottom plate comprises using one of a copper sintering material and a silver sintering material.

In another example of any of the above described exemplary methods for assembling an electronics heat exchanger assembly making the bottom plate and the plurality of pedestals integral comprises joining each pedestal in the plurality of pedestals to the bottom plate via a corresponding plurality pins.

In another example of any of the above described exemplary methods for assembling an electronics heat exchanger assembly each pin in each plurality of pins is press fit into a corresponding through hole of the bottom plate and a corresponding partial opening in a corresponding pedestal.

In another example of any of the above described exemplary methods for assembling an electronics heat exchanger assembly making the bottom plate and the plurality of pedestals integral comprises welding the bottom plate to at least one pedestals in the plurality of pedestals.

In another example of any of the above described exemplary methods for assembling an electronics heat exchanger assembly welding the bottom plate to the at least one pedestal comprises friction stir welding the bottom plate to the at least one pedestal.

These and other features of the present invention can be best understood from the following specification and drawings, the following of which is a brief description.

BRIEF DESCRIPTION OF THE DRAWINGS

FIG. 3 schematically illustrates a side view of a first exemplary heat exchanger configuration for use with the printed circuit board of FIGS. 1 and 2.

FIG. 4 schematically illustrates a side view of a second exemplary heat exchanger configuration for use with the printed circuit board of FIGS. 1 and 2.

FIG. 5 schematically illustrates a side view of a third exemplary heat exchanger configuration for use with the printed circuit board of FIGS. 1 and 2.

FIG. 6 Illustrates a connection weld area of a pedestal in the example heat exchanger of FIG. 5.

FIG. 7 schematically illustrates a process for generating the weld area of FIG. 6.

DETAILED DESCRIPTION

Figure 1:
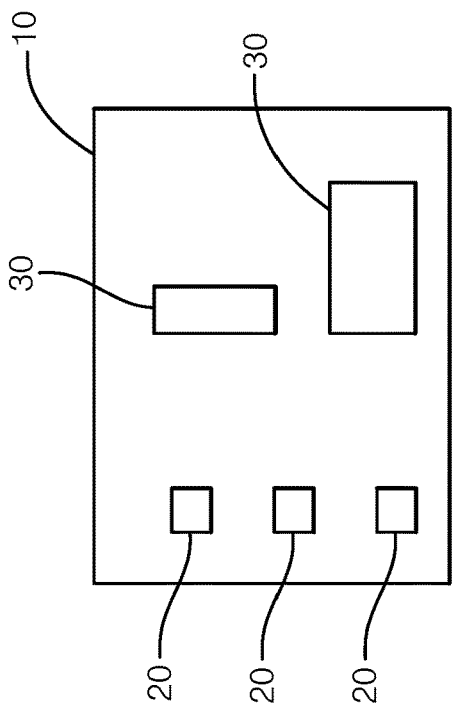
FIG. 1 illustrates an exemplary printed circuit board including multiple heat generating electronic components.

FIG. 1 schematically illustrates a simplified printed circuit board 10 including heat generating electronics 20 such as resistors and capacitors, as well as multiple chip mounts 30 for mounting processors and other computer chips to the printed circuit board 10.

Figure 2:
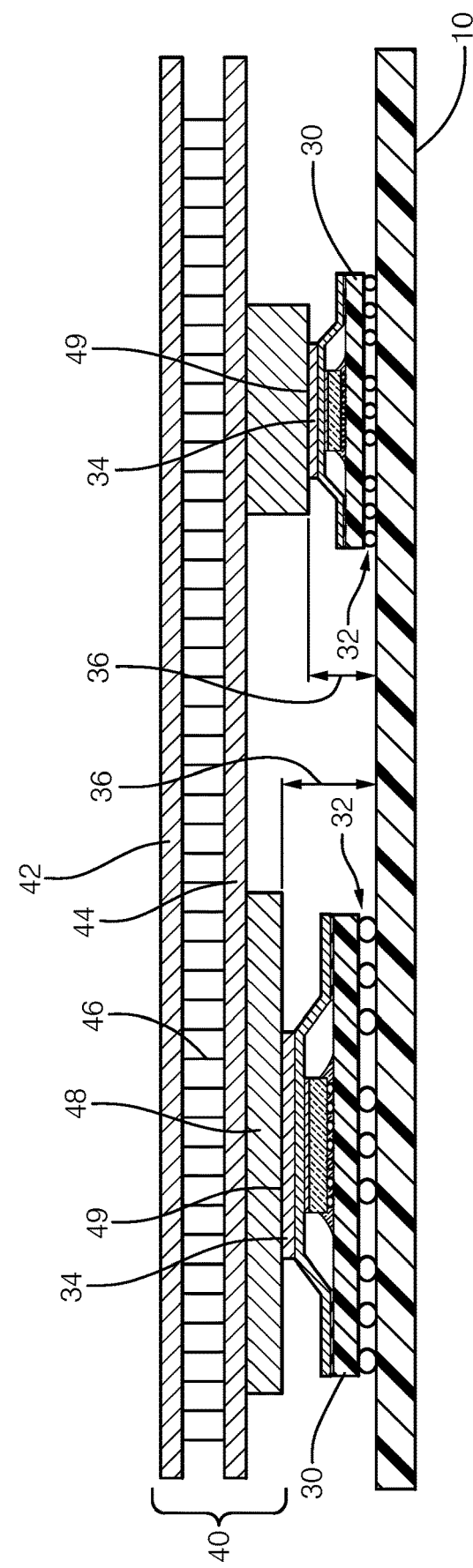
FIG. 2 illustrates a side view of the printed circuit board of FIG. 1, with a portion of the electronic components omitted for clarity.

With continued reference to FIG. 1, FIG. 2 schematically illustrates a side view of the printed circuit board 10 including the chip mounts 30. Each of the chip mounts 30 is connected to the printed circuit board 10 via a corresponding ball grid array (BGA) 32. Further, due to the distinct construction of each of the chip mounts 30 and/or the corresponding chips 34, a height 36 of any given chip mount 30 may be different from the height of other chip mounts 30 on the same printed board 10. As used herein, the height of a component is the maximum distance, normal to the board, that the component extends from the board. Similar variances in the height of the heat generating electronics 20 can occur.

Disposed above the printed circuit board, and contacting each of the heat generating electronics 20 and the chips 34 is a single heat exchanger 40. The heat exchanger 40 is a folded fin type heat exchanger including a top plate 42 and a bottom plate 44. The top and bottom plates 42, 44 are connected by multiple folded fins 46 which define at least one fluid passageway through the heat exchanger. A fluid, such as a liquid or a cooled air is passed through the passageway and absorbs heat from the bottom plate 44. The fluid is then removed from the system, cooled, and returned in order to remove the heat generated by the heat generating electronics 20 and the chips.

In order for the flat heat exchanger 40 to make thermal contact with each of the varied heights 36 of the chips 30 and heat generating electronics 20, multiple pedestals 48 extend toward the printed circuit board 10 from the bottom panel 44. Each of the pedestals 48 has a contact footprint 49 with a surface area at least equal to the exterior facing contact surface of the corresponding heat generating electronic 20 or chip 30. The contact between the electronics and the footprint provides a thermal flowpath from the electronic component to the fluid passage, thereby allowing the heat exchanger to function.

In some examples, the pedestals 48 are constructed of the same material as the bottom panel 40. In alternative examples, the pedestals 48 are a distinct material. In either example, the pedestals 48 and the bottom panel 40 are constructed independently of the bottom panel 40, and are made integral to the bottom panel via an attachment process described herein.

With continued reference to FIG. 2, FIG. 3 schematically illustrates a side view of a first example heat exchanger 100. In the example heat exchanger 100 of FIG. 3, each of the pedestals 148 is brazed to the bottom plate 144, and is maintained in position during the brazing process via multiple pins 160. Each of the pins 160 is a wedge shaped pin configured to press fit into a corresponding opening 162 in the bottom plate 144, and a corresponding partial opening 164 in the pedestal 148. In some examples, each of the pins 160 is constructed of the same material as the bottom panel 144 and the pedestals 148, resulting in a consistent thermal path across the entirety of the pedestal 148.

In an alternative example, the pins 160 can be constructed of a distinct material, resulting in a different rate of thermal transfer at the location of the pins 148. In order to mitigate the different thermal transfer rates, the pedestals 148 are oversized in such an example, and the contact footprint of the corresponding electronics 20 or chips 30 is entirely within a perimeter defined by lines connecting each of the pins 148.

In order to construct the end structure of FIG. 3, initially a brazing material is applied to an upper surface 170 of each pedestal 148. After the brazing material is applied, the bottom panel 144 is placed on top of the pedestals 148. The bottom panel 144 includes through holes 162 aligned with the pin holes 164 in the pedestals. On the bottom panel 144 is placed, the pins 160 are inserted into the holes 162, 164. The pins 160 are press fit into the holes 162, 164, and maintain the relative position of the pedestals 48 and the bottom panel 144.

Once the pins 160 have been inserted, the folded pin structure is placed on top of the bottom panel, and the top plate is placed on top of the folding pin structure. Once all the pieces are in position, the entire structure is subjected to a brazing process which renders the pedestals 148 integral with the bottom plate 144, and a remainder of the heat exchanger.

With continued reference to FIGS. 1-3, FIG. 4 schematically illustrates a side view of another alternative assembly 200 for making uneven heat exchanger pedestals integral to the heat exchanger. The assembly 200 of FIG. 4 includes pedestals 248 of differing heights integrally connected to a bottom layer 244 of a flat panel heat exchanger 240 via a sintering layer 270. The sintering layer 270 is in some examples a silver sintering layer. In alternative examples, the sintering layer 270 is a copper sintering layer. In yet further examples, the sintering layer 270 can be another suitable sintering material.

As the construction of the pedestals 248 of the assembly 200 includes a consistent thermal flowpath across the entirety of the pedestal 248, the contact footprint 249 of each pedestal can be limited to the size of the contact footprint of the corresponding electronics or chips. Alternatively, the contact footprint 249 of each pedestal 248 can be larger than the contact footprint of the corresponding chip or electronics. By increasing the size of the pedestal contact footprint 249 to be larger than the size of the contact footprint of the corresponding chip or electronics, connection of the heat exchanger to the circuit board is eased by allowing for certain levels of misalignment to still provide adequate thermal pathways to the heat exchanger 240.

As with the previously described heat exchanger (of FIG. 3), the pedestals 248 are initially constructed as distinct elements and then made integral with the heat exchanger components to form the illustrated assembly 200. To form the assembly 200, initially a layer of silver or copper sintering material is applied to the pedestals 248. Once the sintering material has been applied, the pedestals 248 are sintered to the bottom plate 244. The sintering is performed at a temperature and pressure corresponding to the type of sintering material. For example, a silver sintering material is sintered at 10-20 MPa at 250 degrees C. In another example, a copper sintering material is sintered at 15 MPa at 300 degrees C. in a Nitrogen environment. In yet another example, a silver pressure less or pressure lite sintering material is sintered form 0 to 5 MPa at 240 degrees C.

Once the pedestals 248 have been sintered to the bottom panel 244 of the heat exchanger, the folded fins and the top panel are positioned on top of the bottom plate 244, and the entire assembly is brazed together in a final brazing process.

With continued reference to FIGS. 1-4, FIGS. 5, 6, and 7 schematically illustrates a side view of another alternative assembly 300 for making uneven heat exchanger pedestals integral to the heat exchanger using a friction welding process. FIG. 6 schematically illustrates the completed assembly 300, FIG. 6 schematically illustrates the friction welding process, and FIG. 7 schematically illustrates a weld spot contact footprint of a pedestal of the completed assembly 300.

As with the previous example, the assembly 300 of FIG. 5 includes multiple pedestals 348, each of which is connected to a bottom plate 344 of the heat exchanger assembly 340 via a friction weld 380, such as a friction stir weld. Each of the pedestals is connected to the bottom plate, before the heat exchanger assembly 300 is completed. Once the welding operations have been completed, the fins and top plate are added and the completed structure is brazed to form the integral heat exchanger 340 and pedestal 348 assembly 300.

With reference to FIG. 5, FIG. 6 illustrates the process for welding the bottom plate 344 to the pedestals 348. In the illustrated example a friction stir welding horn 384 is pressed against the top plate and rotated. The rotation causes friction between the horn 384 and the bottom plate 244. The friction, in turn, generates heat which causes a portion of the bottom plate 344 and the corresponding pedestal 348 to melt together forming a weld zone 380. Once it cools the weld zone 380 solidifies making the pedestal and the bottom plate 344 integral. During the weld process the rotating weld horn 384 is dragged across the weld zone 380 to ensure maximum connection between the pedestal 348 and the bottom plate 344.

In one example, illustrated in FIG. 7, the weld zone 380 is dragged in a rectangular pattern to cover the maximum surface area of the contact footprint between the pedestal 348 and the bottom plate 344. While the weld does not cover an entirety contact footprint, due to the circular shape of the weld, it is appreciated that a sufficient quantity of coverage of the weld zone will provide sufficient thermal transfer between the corresponding electronics or chips and the pedestal 344. In some examples a sufficient coverage area is at least 60% of the surface area of the contact footprint.

While illustrated and described independently above, it is appreciated that certain heat exchanger assemblies can incorporate multiple schemes for making the pedestal integral with the bottom plate can be utilized in any given assembly depending on the needs and design of the system in which the heat exchanger assembly is to be incorporated.

It is further understood that any of the above described concepts can be used alone or in combination with any or all of the other above described concepts. Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. An electronics heat exchanger comprising:
   a fluid flow body having a first panel, a second panel, and at least one folded fin fluid flow guide connecting the first panel and the second panel;
   a plurality of pedestals extending from the second panel, the plurality of pedestals including at least a first pedestal having a first height and a second pedestal having a second height, distinct from the first height;
   wherein each of the pedestals is integral with the second panel; and
   a plurality of pins each pin in the plurality of pins protruding through a corresponding through hole in the second panel and into a corresponding partial opening in a pedestal in the plurality of pedestals.

2. The electronics heat exchanger of claim 1, wherein each of the pedestals comprises a first material and wherein the second panel is comprised of the first material.

3. The electronics heat exchanger of claim 1, wherein at least one of the pedestals comprises a first material and the second panel is comprised of a second material distinct from the first material.

4. The electronics heat exchanger of claim 1, wherein each pin is comprised of a first material and a corresponding pedestal is comprised of the first material, and wherein the pedestal includes a consistent thermal path across the entirety of the pedestal.

5. The electronics heat exchanger of claim 1, wherein each pin is press fit with at least one of the corresponding through hole and the corresponding partial opening.

6. The electronics heat exchanger of claim 1, wherein each pedestal defines a corresponding contact footprint having a perimeter defined by lines connecting each of the pins in the plurality of pins and having a consistent thermal path across the contact footprint, and wherein each contact footprint is smaller than a perimeter of the pedestal.

7. The electronics heat exchanger of claim 1, wherein each pedestal defines a corresponding contact footprint and the corresponding contact footprint covers an entire surface of the pedestal.

8. The electronics heat exchanger of claim 1, further comprising a sinter layer disposed between each pedestal in the plurality of pedestals and the second panel.

9. The electronics heat exchanger of claim 8, wherein the sinter layer is comprised of one of a silver sintering material and a copper sintering material.

10. The electronics heat exchanger of claim 1, further comprising a plurality of weld zones each weld zone connecting a corresponding pedestal to the second panel.

11. The electronics heat exchanger of claim 10, wherein each weld zone is smaller than a corresponding contact footprint, and wherein each weld zone defines a consistent thermal path through the pedestal.

12. The electronics heat exchanger of claim 1, wherein the partial opening extends less then a full height of the pedestal normal to the second panel.

* * * * *